(12) United States Patent
Gau

(10) Patent No.: US 6,949,438 B2
(45) Date of Patent: Sep. 27, 2005

(54) METHOD OF FABRICATING A BIPOLAR JUNCTION TRANSISTOR

(75) Inventor: Jing-Horng Gau, Hsin-Chu Hsien (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/904,595

(22) Filed: Nov. 18, 2004

(65) Prior Publication Data

US 2005/0112837 A1 May 26, 2005

Related U.S. Application Data

(62) Division of application No. 10/707,215, filed on Nov. 26, 2003.

(51) Int. Cl.[7] ............................................. H01L 21/331
(52) U.S. Cl. ....................................... 438/309; 438/353
(58) Field of Search ................................ 438/186, 188, 438/189, 202, 234, 309, 311, 312, 318, 343

(56) References Cited

U.S. PATENT DOCUMENTS

| | | | | |
|---|---|---|---|---|
| 6,492,711 B1 * | 12/2002 | Takagi et al. | ................ | 257/593 |
| 6,627,972 B1 * | 9/2003 | Ehwald et al. | ............... | 257/586 |
| 6,673,703 B2 * | 1/2004 | Menut et al. | ................ | 438/522 |
| 6,706,583 B1 * | 3/2004 | Comard | ...................... | 438/235 |
| 6,777,302 B1 * | 8/2004 | Chen et al. | ................ | 438/335 |
| 6,815,304 B2 * | 11/2004 | Sankin et al. | ............... | 438/348 |

* cited by examiner

*Primary Examiner*—Michael Lebentritt
*Assistant Examiner*—Scott B. Geyer
(74) *Attorney, Agent, or Firm*—Winston Hsu

(57) ABSTRACT

A substrate with a plurality of isolation structures for defining at least an active area thereon is provided. Ions of a first conductive type are implanted into the substrate to form a doping region in the active area. Following that, a protective layer is formed on the substrate, the protective layer having an opening to expose the doping region. A first doping layer of a second conductive type and a second doping layer of the first conductive type are formed on the doping region, respectively, to complete fabrication of a bipolar junction transistor.

9 Claims, 24 Drawing Sheets

METHOD OF FABRICATING A BIPOLAR JUNCTION TRANSISTOR

CROSS REFERENCE TO RELATED APPLICATIONS

This application is a divisional of application Ser. No. 10/707,215 filed Nov. 26, 2003.

BACKGROUND OF INVENTION

1. Field of the Invention

The present invention relates to a method of fabricating a bipolar junction transistor (BJT), and more particularly, to a method of fabricating a vertical BJT.

2. Description of the Prior Art

A BJT utilizes two types of carriers, "electrons" and "hot holes", to transmit current. The BJT continues to be a basic circuit element in integrated circuits due to its high switching capability and current carrying capacity. A BiCMOS transistor is constructed by a particular combination of the BJT and a complementary metal oxide semiconductor (CMOS) transistor positioned on the same integrated circuit, so as to speed up an operation of the CMOS transistor. Currently, multiple masking steps are used to combine sequences of the BJT fabrication steps and the CMOS transistor fabrication steps, which increasing complication of the total processing steps.

Referring to FIGS. 1–6, FIGS. 1–6 are schematic diagrams of a method of fabricating a BJT according to the prior art. In the conventional method of fabricating a BiCMOS transistor, masking steps for fabricating the BJT are added into the processing steps of the CMOS transistor. Since the processing steps of the CMOS transistor are already well known by the current industry, they are not shown in FIGS. 1–6. FIGS. 1–6 are focused on illustrating the processing steps of the BJT only. As shown in FIG. 1, a P− silicon substrate having a buried N+ doping region 12 and an N+ epitaxial layer 14 positioned on the buried N+ doping region 12 is provided. Normally, the buried N+ doping region 12 is positioned at a predetermined depth within the substrate 10. In order to avoid a misalignment between the buried N+ doping region 12 and other devices, several alignment marks (not shown) are often formed on the substrate 10, for example formed in scribe lines of the substrate 10.

As shown in FIG. 2, an N well 16 is formed on the substrate 10, and a plurality of field oxide layers 20 are formed on the N well 16 to define positions for forming a collector and a base of the BJT. Following that, an ion implantation process is performed to form a buried P+ doping region 18 around the N well 16. The buried P+ doping region 18 is used as a channel stop to prevent ions of the N well 16 from diffusing into adjacent devices.

As shown in FIG. 3, another ion implantation process is performed to form an N+ collector 22 in the N well 16. A thermal treatment is then used to drive in the N well 16 and the N+ epitaxial layer 14 into the N+ collector 22, thus contacting the N+ collector 22 with the buried N+ doping region 12. As shown in FIG. 4, a mask 24 is formed in the substrate 10, the mask 24 having an opening therein to expose the position for forming the base of the BJT. Following that, an ion implantation process is performed to form a P+ base 26 on a portion of the N well 16 not covered by the mask 24.

As shown in FIG. 5, a doped polysilicon layer 28 is deposited on the substrate 10 followed by using a photo- lithographic process and an etching process to remove a portion of the polysilicon layer 28, thus forming an N+ emitter 28 on the P+ base 26. Normally, the deposition process of the polysilicon layer 28 can be used to deposit a polysilicon layer of a gate structure of the CMOS transistor, too. In addition, the polysilicon layer 28 can be doped together with a source/drain of the CMOS transistor. Following that, depending on the characteristic demands of the products, a spacer 30 is optionally formed on either side of the N+ emitter 28, so that a self-aligned silicidation process can be used to form a silicide layer on surfaces of the N+ collector 22, the P+ base 26 and the N+ emitter 28 to reduce their contact resistance. Alternatively, a dielectric layer (not shown), such as a borophosphosilicate glass (BPSG) can be formed on the substrate 10. The dielectric layer has several openings therein to respectively connect to the N+ collector 22, the P+ base 26 and the N+ emitter 28, thus enabling a subsequent process to form several self-aligned contact plugs to connect to the N+ collector 22, the P+ base 26 and the N+ emitter 28, respectively.

As mentioned above, a plurality of masks are used to fabricate the BJT according to the prior art. For example, different masks are required to define the patterns of the alignment marks, the buried N+ doping region 12, the buried P+ doping region 18, the N+ collector 22, the P+ base 26 and the N+ emitter 28, and to combine the sequences of the BJT fabrication steps with the CMOS transistor fabrication steps. In this case, the total processing steps of the BJT become very complicated. In addition, during the repeated masking steps, such as forming the masks and removing the masks, the device is possible damaged to have a bad electrical performance.

SUMMARY OF INVENTION

It is therefore an object of the claimed invention to provide a method of forming a BJT, so as to reduce the total numbers of masks for fabricating the BJT, simplify the processing steps and reduce the production costs.

According to the claimed invention, a substrate with a plurality of isolation structures for defining at least an active area thereon is provided. Ions of a first conductive type are implanted into the substrate to form a doping region in the active area. Following that, a protective layer is formed on the substrate, the protective layer having an opening to expose the doping region. A first doping layer of a second conductive type and a second doping layer of the first conductive type are formed on the doping region, respectively, to complete fabrication of the BJT.

It is an advantage of the present invention that the doping region formed in the substrate is used as a collector of the BJT. Therefore, the processing steps of forming the structures of the alignment marks, the buried doping region, the epitaxial layer, the collector and the channel stops as in the conventional BJT are not necessary in the present invention. As a result, the total number of masks for fabricating the BJT of the present invention can be effectively reduced, so as to simplify the processing steps and reduce the production costs. In comparison with the buried doping regions, the epitaxial layer and the collector of the conventional BJT, a shallower collector is formed in the present invention. Therefore, the resistance of the collector can be reduced and a better electrical performance can be provided by the BJT of the present invention. In addition, the present invention may further use the doping region as an emitter, and use the second doping layer as a collector of the BJT. In this case, the advantages of omitting the conventional steps of fabricating the buried doping region, the epitaxial layer, the collector and the channel stops can also be approached. The total number of masks for fabricating the BJT is therefore reduced to simplify the processing steps and reduce the production costs. Furthermore, the resistance of the collector can be reduced to provide a better electrical performance according to the present invention.

These and other objects of the claimed invention will be apparent to those of ordinary skill in the art after reading the following detailed description of the preferred embodiment that is illustrated in the various figures and drawings.

DETAILED DESCRIPTION

Referring to FIGS. 7–14, FIGS. 7–14 are schematic diagrams of a method of fabricating a BJT according to a first embodiment of the present invention. Since the present method of fabricating the BJT can be optionally combined with processing steps of a CMOS transistor and the processing steps of the CMOS transistor are already well known by the current industry, FIGS. 7–14 are focused on illustrating the processing steps of the BJT only.

Figure 1:
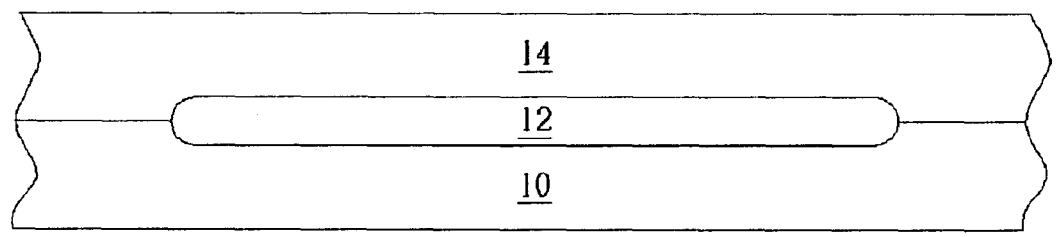
FIGS. 1–6 are schematic diagrams of a method of fabricating a BJT according to the prior art.
Figure 2:
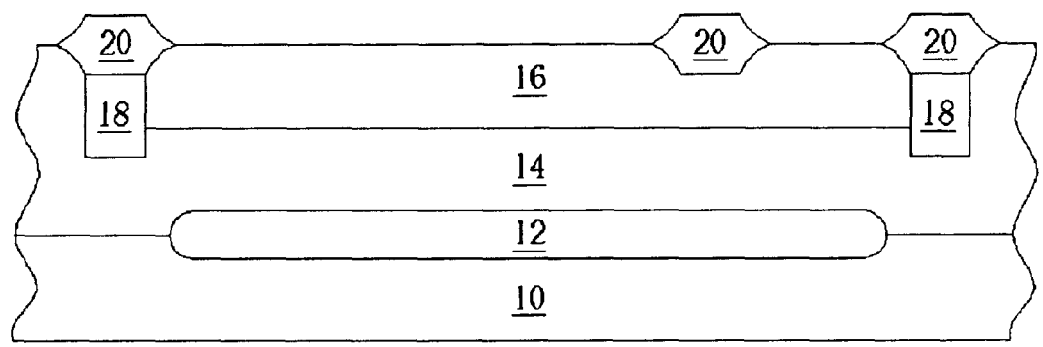
Figure 3:
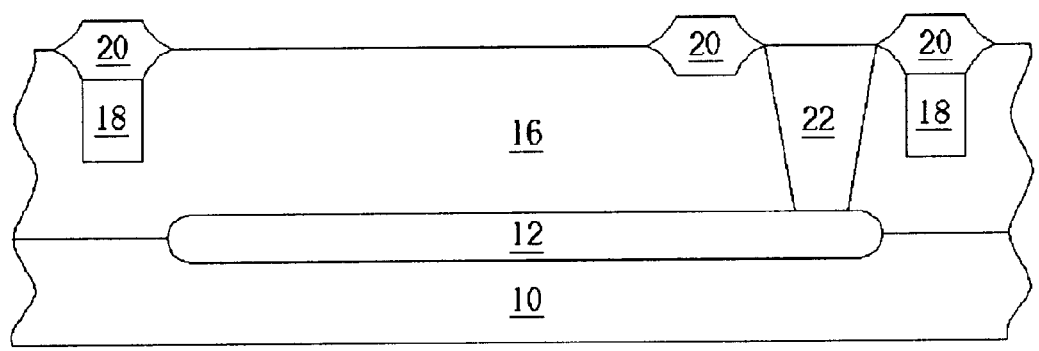
Figure 4:
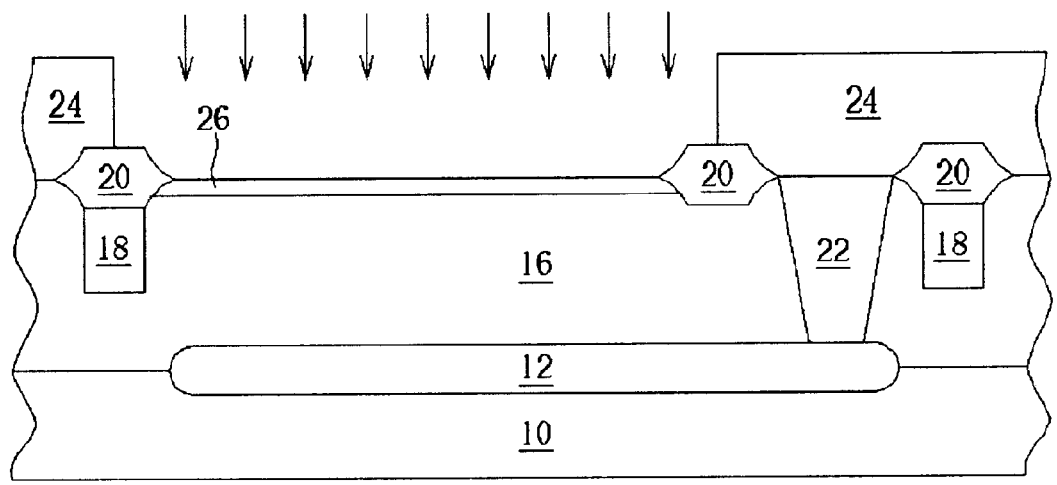
Figure 5:
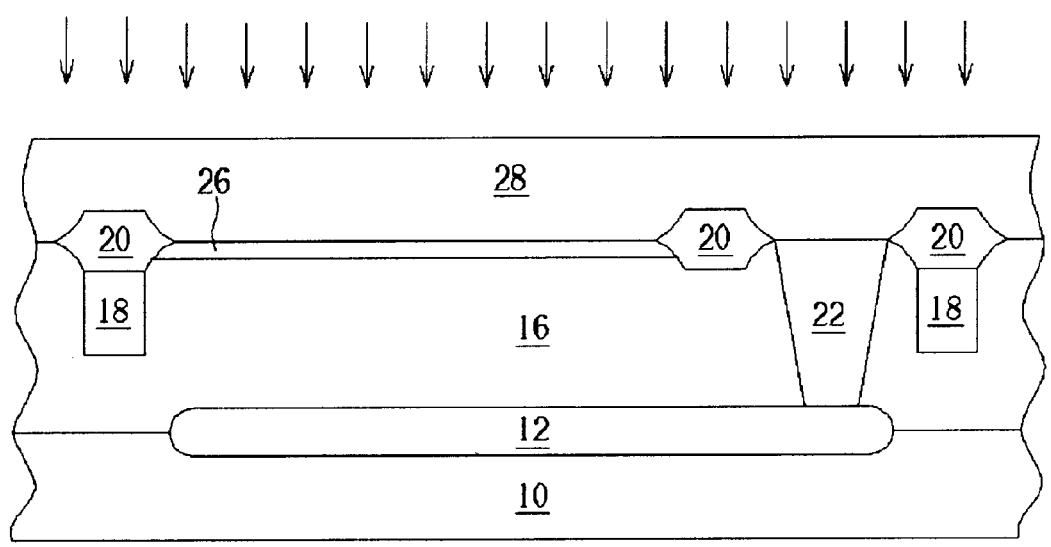
Figure 6:
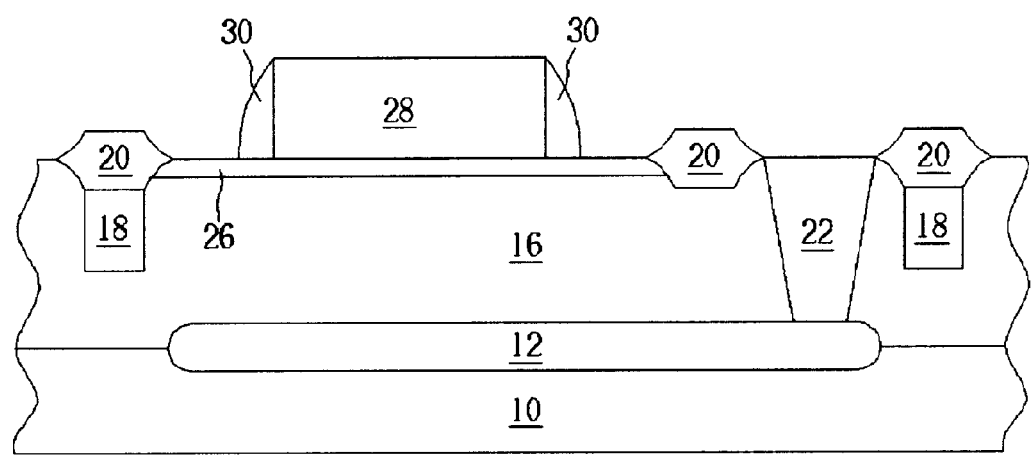
Figure 7:
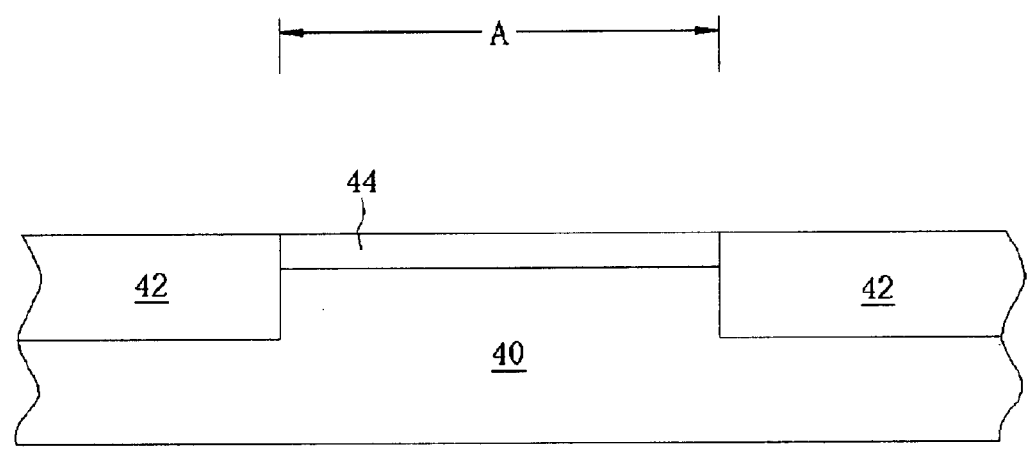
FIGS. 7–14 are schematic diagrams of a method of fabricating a BJT according to a first embodiment of the present invention.

As shown in FIG. 7, a substrate 40 with a plurality of isolation structures 42 for defining at least an active area A on the substrate 40 is provided. The isolation structures 42 can be shallow trench isolation (STI) or field oxide layers. The substrate 40 can be a P-type silicon substrate. Then, an ion implantation process is performed, for example a doping process for forming a source/drain of an NMOS of a CMOS transistor on the substrate 40 is used together with a thermal treatment to form an N-type doping region 44 within the active area A. The N-type doping region 44 is used as an emitter of the BJT. Alternatively, the substrate 40 can be an N-type silicon substrate. In this case, an ion implantation process for forming a source/drain of a PMOS of a CMOS transistor on the substrate 40 is performed to form a P-type doping region 44 within the active area A. The P-type doping region 44 is used as an emitter of the BJT.

Furthermore, the doping region 44 can also be used as a collector of the BJT. In this case, a doping process for forming a source/drain, an LDD, or a doping well of an NMOS or a PMOS can be selected to form the doping region 44, depending on the conductive type and the doping concentration of the doping region 44. An independent doping process with a specific dosage can be selected to dope the substrate 40 to form the doping region 44, too.

Figure 8:
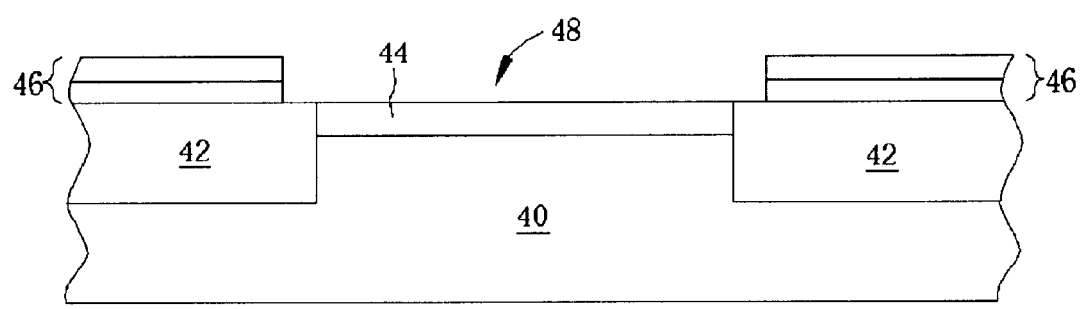

As shown in FIG. 8, a protective layer 46 is formed on the substrate 40. The protective layer 46 includes an opening 48 to expose the doping region 44 and functions to cover the CMOS transistor or other devices on the substrate 40, thus facilitating the subsequent processes for forming a base and a collector over the doping region 44. The protective layer 46 can be an oxide layer, a silicon nitride layer, or a composite layer composed of oxide, silicon nitride and other dielectric materials. If the processing steps of the BJT are not combined to the processing steps of the CMOS transistor, the protective layer 46 can be omitted.

Figure 9:
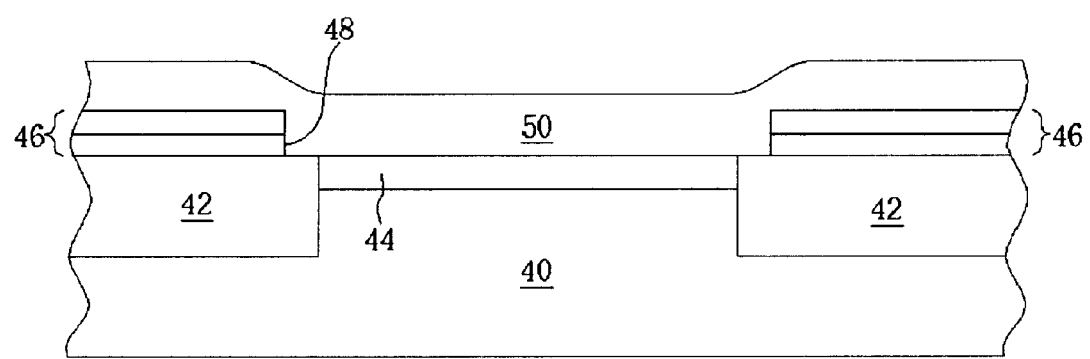
Figure 10:
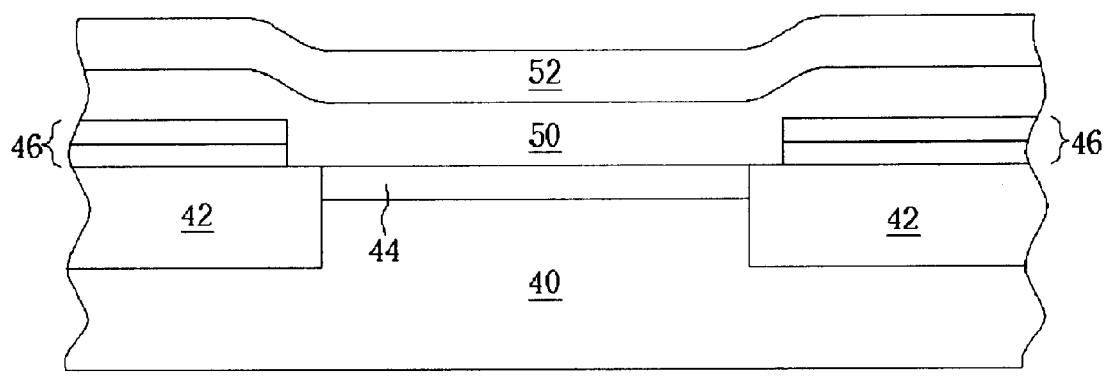

As shown in FIGS. 9 and 10, two doping layers 50 and 52 of different conductive types are formed on the substrate 40, respectively. When the doping region 44 is an N-type doping region, the doping layer 50 is a P-type doping layer, such as a doped P-type polysilicon layer or a P-type epitaxial layer made of silicon, silicon germanium, or a composite of silicon and silicon germanium. In this case, the doping layer 52 is an N-type doping layer, such as a doped N-type polysilicon layer or an N-type epitaxial layer made of silicon, silicon germanium, or a composite of silicon and silicon germanium. Contrarily, when the doping region 44 is a P-type doping region, the doping layer 50 is an N-type doping layer, such as a doped N-type polysilicon layer or an N-type epitaxial layer made of silicon, silicon germanium, or a composite of silicon and silicon germanium. In this case, the doping layer 52 is a P-type doping layer, such as a doped P-type polysilicon layer or a P-type epitaxial layer made of silicon, silicon germanium, or a composite of silicon and silicon germanium.

Figure 11:
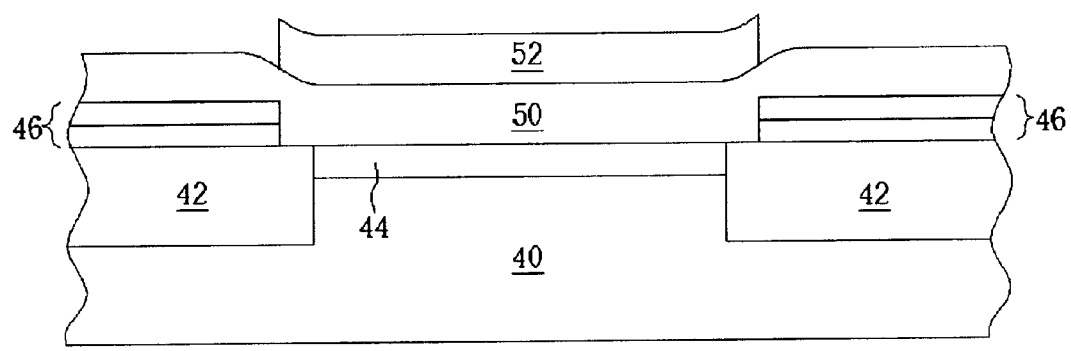
Figure 12:
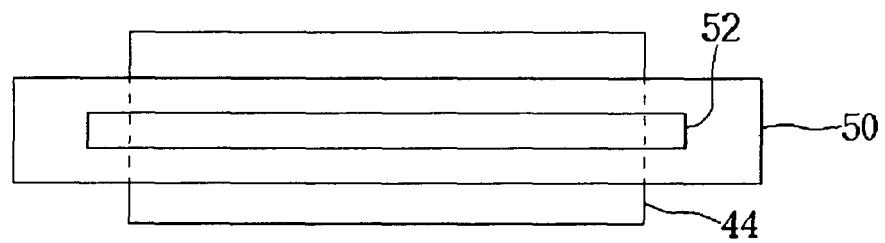

As shown in FIG. 11, a photolithographic process and an etching process are then used to remove a portion of the doping layer 52 to define the pattern of a collector (emitter) of the BJT. As shown in FIG. 12, a top view of the BJT indicates that the doping layer 52 covers a portion of the doping layer 50 and the doping layer 50 covers a portion of the doping region 44, so as to reserve the space for forming contact plugs (silicide layers) on the doping layer 50 and the doping region 44.

Figure 13:
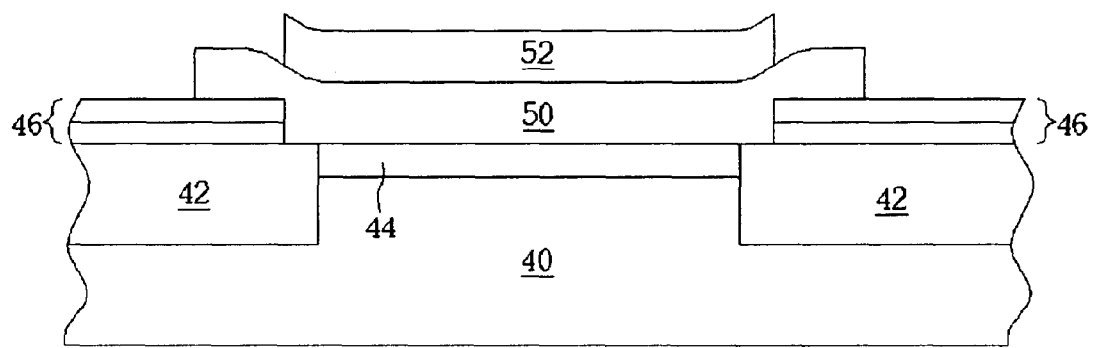
Figure 14:
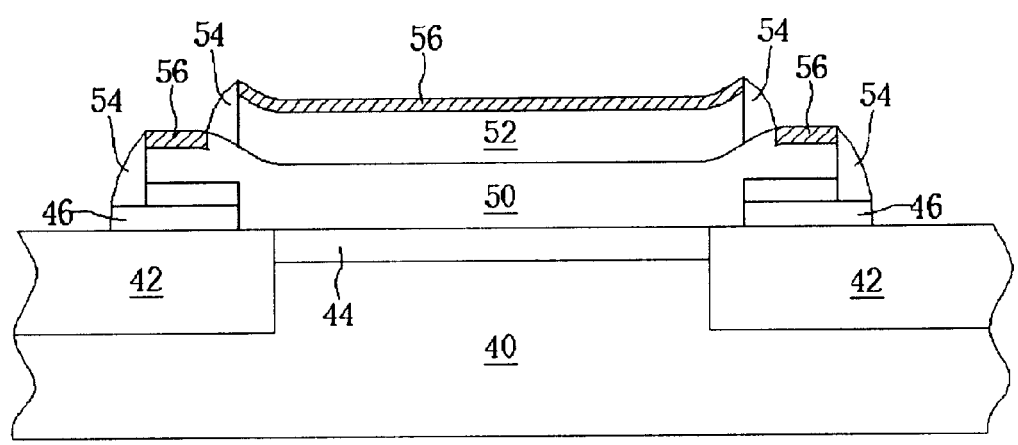

Before the removal of the photoresist layer for patterning the doping layer 52, an ion implantation process can be optionally performed to implant ions of the same conductive type with the doping layer 50 into the doping layer 50, so as to reduce the resistance of the doping layer 50. Following that, as shown in FIG. 13, another photolithographic and etching processes are used to remove a portion of the doping layer 50, so as to define the pattern of a base of the BJT. Finally, as shown in FIG. 14, a spacer 54 is formed on either side of the doping layer 50 and on either side of the doping layer 52. A self-aligned silicidation process is performed to form a silicide layer 56 on surfaces of the doing region 44, the doping layer 50 and the doping layer 52 to complete fabrication of the BJT.

Figure 15A:
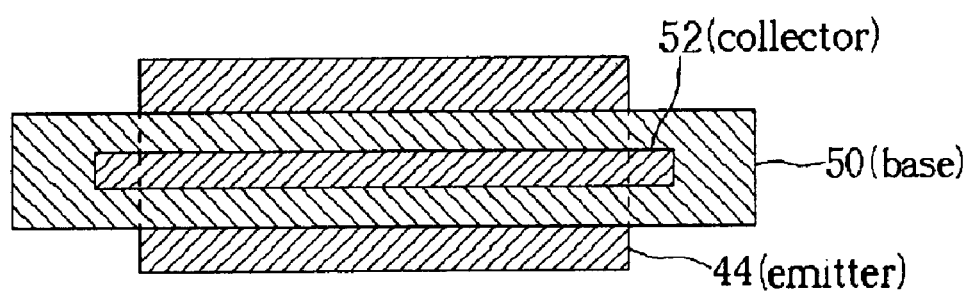
FIGS. 15A and 15B are top views of a BJT according to the present invention.
Figure 15B:
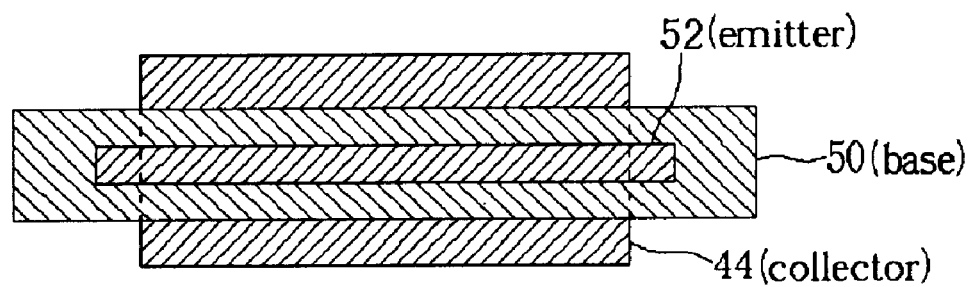

Please refer to FIGS. 15A and 15B of top views of a BJT of the present invention. As shown in FIG. 15A, the doping concentrations of the doping regions 44, the doping layer 50 and the doping layer 52 can be controlled according to the present invention, so that the doping layer 52 positioned above the doping layer 50 and the doping region 44 can be used as a collector of the BJT, the doing layer 50 positioned between the doping layer 52 and the doping region 44 can be used as a base of the BJT, and the doping region 44 positioned below the doping layers 50 and 52 can be used as an emitter of the BJT. As shown in FIG. 15B, the doping concentrations of the doping regions 44, the doping layer 50 and the doping layer 52 can be adjusted according to the present invention, so that the doping layer 52 positioned above the doping layer 50 and the doping region 44 can be used as an emitter of the BJT, the doing layer 50 positioned between the doping layer 52 and the doping region 44 can be used as a base of the BJT, and the doping region 44 positioned below the doping layers 50 and 52 can be used as a collector of the BJT.

Referring to FIGS. 16–24, FIGS. 16–24 are schematic diagrams of a method of fabricating a BJT according to a second embodiment of the present invention. Since the present method of fabricating the BJT can be optionally combined with processing steps of a CMOS transistor and the processing steps of the CMOS transistor are already well known by the current industry, FIGS. 16–24 are focused on illustrating the processing steps of the BJT only.

Figure 16:
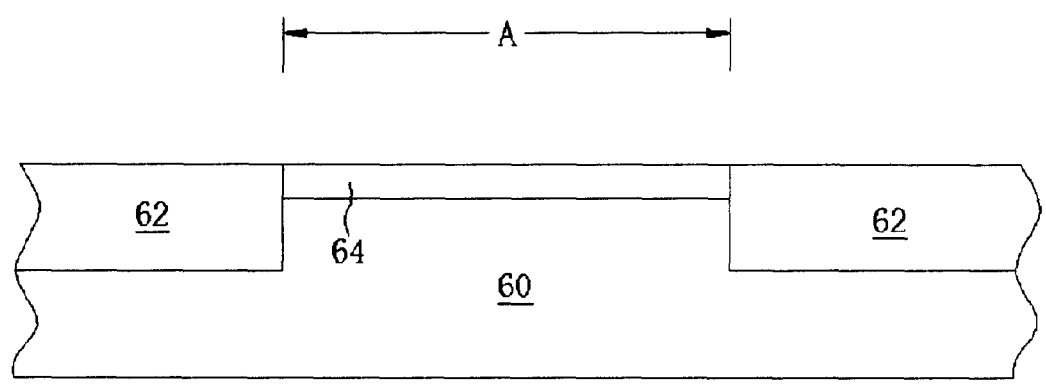
FIGS. 16–24 are schematic diagrams of a method of fabricating a BJT according to a second embodiment of the present invention.

As shown in FIG. 16, a substrate 60 with a plurality of isolation structures 62 for defining at least an active area A on the substrate 60 is provided. The isolation structures 62 can be shallow trench isolation or field oxide layers. The substrate 60 can be a P-type silicon substrate. Then, an ion implantation process is performed, for example a doping process for forming a source/drain of an NMOS of a CMOS transistor on the substrate 60 is used together with a thermal treatment to form an N-type doping region 64 within the active area A. The N-type doping region 64 is used as an emitter of the BJT. Alternatively, the substrate 60 can be an N-type silicon substrate. In this case, an ion implantation process for forming a source/drain of a PMOS of a CMOS transistor on the substrate 60 is performed to form a P-type doping region 64 within the active area A. The P-type doping region 64 is used as an emitter of the BJT.

Furthermore, the doping region 64 can also be used as a collector of the BJT. In this case, a doping process for forming a source/drain, an LDD, or a doping well of an NMOS or a PMOS can be selected to form the doping region 64, depending on the conductive type and the doping concentration of the doping region 64. An independent doping process with a specific dosage can be selected to dope the substrate 60 to form the doping region 64, too.

Figure 17:
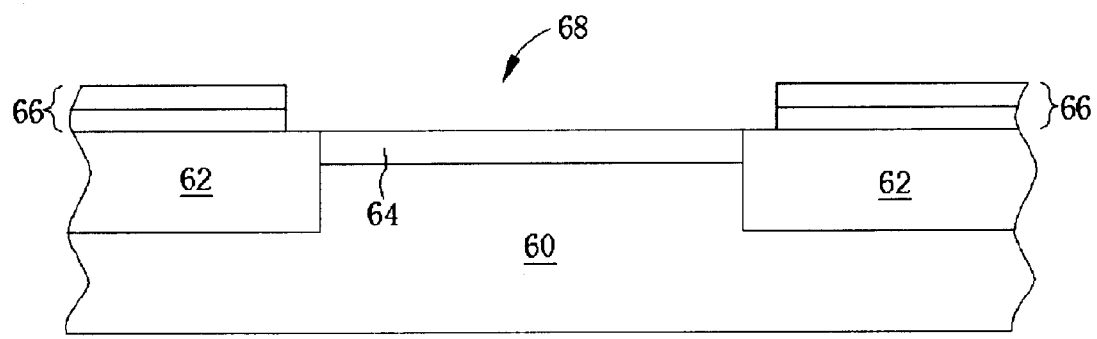

As shown in FIG. 17, a protective layer 66 is formed on the substrate 60. The protective layer 66 includes an opening 68 to expose the doping region 64 and functions to cover the CMOS transistor or other devices on the substrate 60, thus facilitating the subsequent processes for forming a base and a collector over the doping region 64. The protective layer 64 can be an oxide layer, a silicon nitride layer, or a composite layer composed of oxide, silicon nitride and other dielectric materials. If the processing steps of the BJT are not combined to the processing steps of the CMOS transistor, the protective layer 66 can be omitted.

Figure 18:
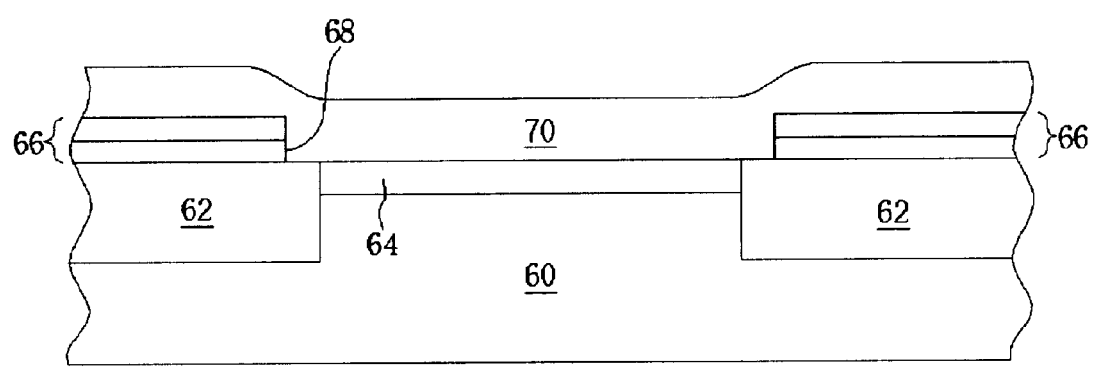
Figure 19:
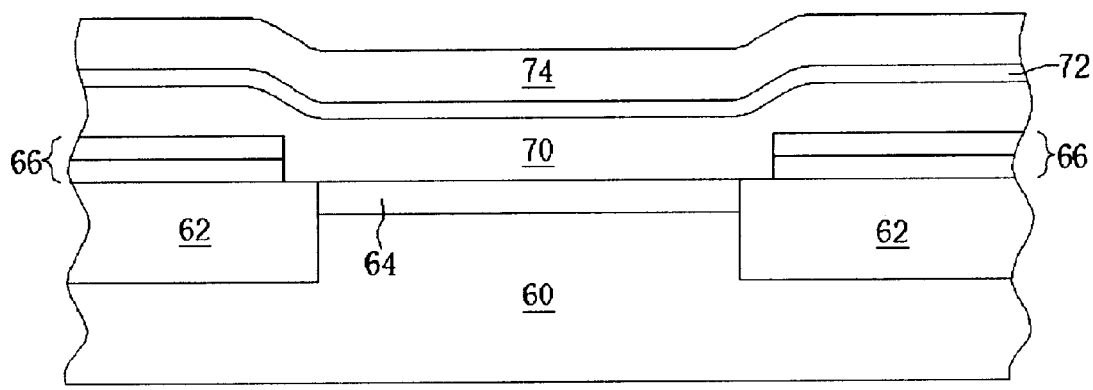

As shown in FIGS. 18 and 19, a doping layer 70, a stop layer 72 and a dielectric layer 74 are formed on the substrate 60, respectively. When the doping region 64 is an N-type doping region, the doping layer 70 is a P-type doping layer, such as a doped P-type polysilicon layer or a P-type epitaxial layer made of silicon, silicon germanium, or a composite of silicon and silicon germanium. Contrarily, when the doping region 64 is a P-type doping region, the doping layer 70 is an N-type doping layer, such as a doped N-type polysilicon layer or an N-type epitaxial layer made of silicon, silicon germanium, or a composite of silicon and silicon germanium. The stop layer 72 can be an oxide layer, a silicon nitride layer or a composite layer composed of oxide, silicon nitride and other dielectric materials. The dielectric layer 74 is made of oxide.

Figure 20:
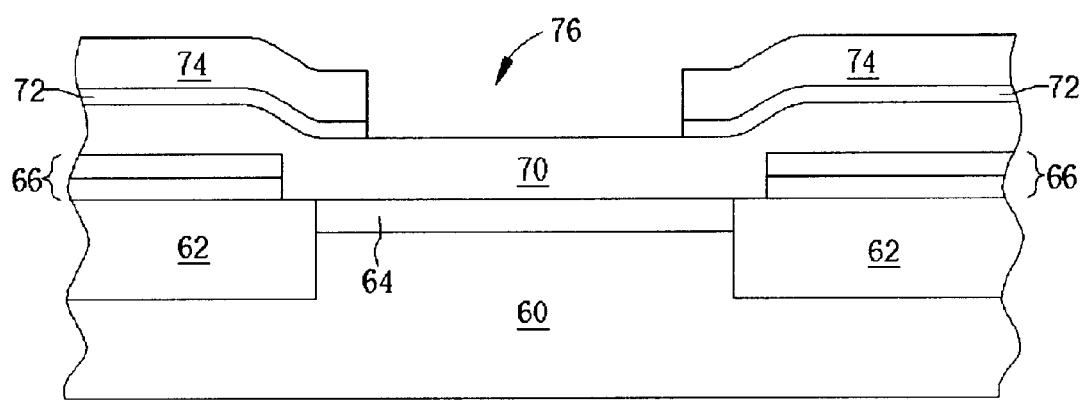
Figure 21:
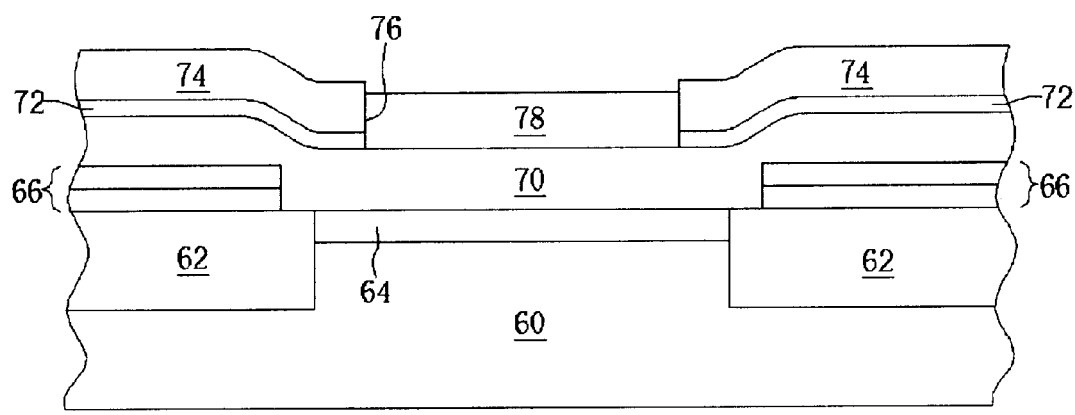

As shown in FIG. 20, a photolithographic process and an etching process are then used to remove portions of the dielectric layer 74 and the stop layer 72, thus forming an opening 76 within the dielectric layer 74 to expose a portion of the doping layer 70. The opening 76 is used to define the pattern of a collector (emitter) of the BJT. As shown in FIG. 21, a doping layer 78 having a conductive type different from that of the doping layer 70 is thereafter deposited on the substrate 60 to fill the opening 76. When the doping layer 70 is a P-type doping layer, the doping layer 78 is an N-type doping layer, such as a doped N-type polysilicon layer or an N-type epitaxial layer made of silicon, silicon germanium, or a composite of silicon and silicon germanium. Contrarily, when the doping layer 70 is an N-type doping layer, the doping layer 78 is a P-type doping layer, such as a doped P-type polysilicon layer or a P-type epitaxial layer made of silicon, silicon germanium, or a composite of silicon and silicon germanium. Subsequently, a planarization process, such as an etching back process or a chemical mechanical polish process, is performed to remove a portion of the doping layer 78 to make the substrate 60 have an approximately flat surface.

Figure 22:
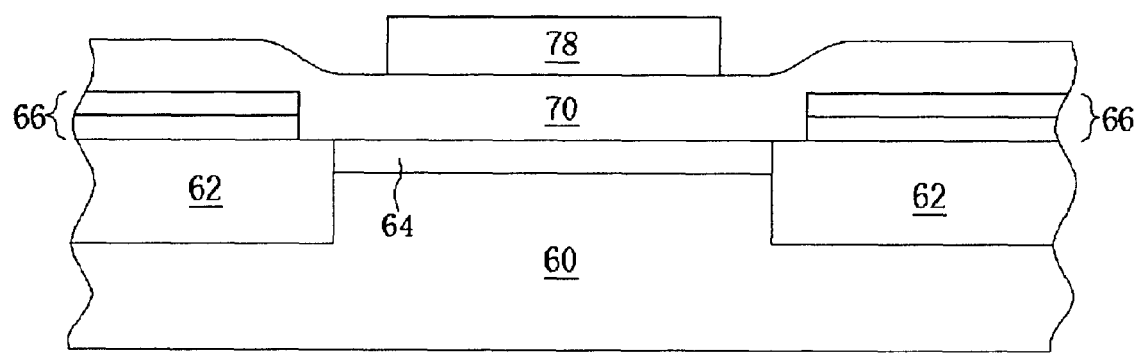
Figure 23:
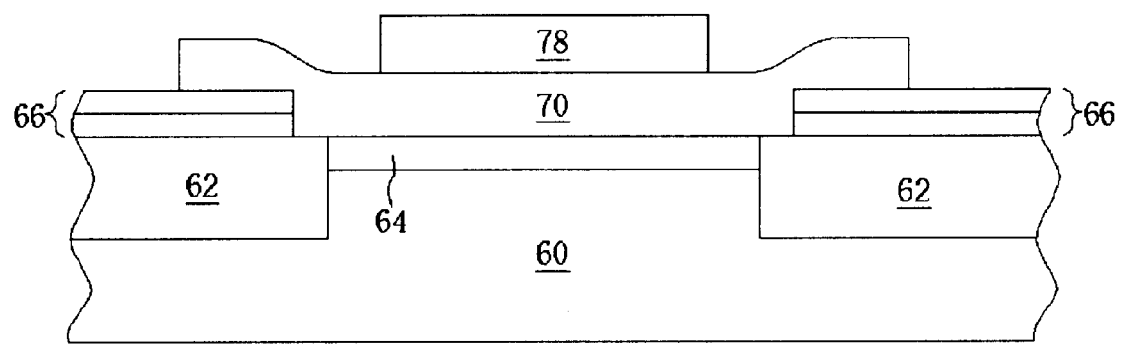
Figure 24:
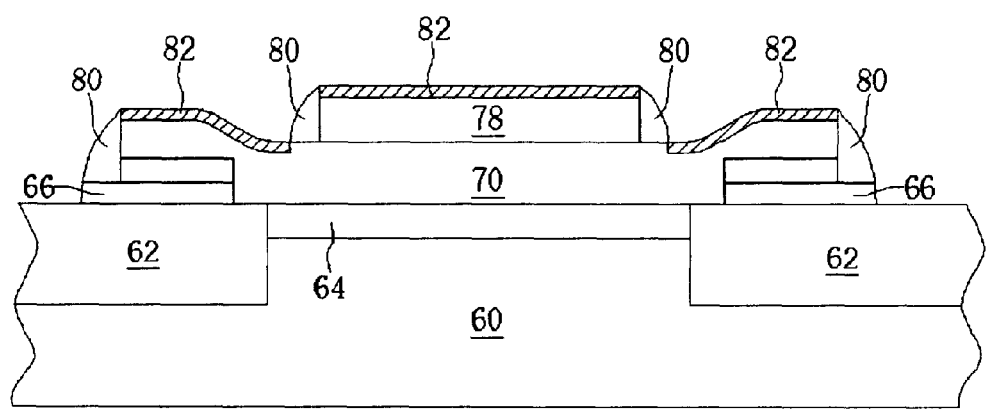

As shown in FIG. 22, after the removal of the dielectric layer 74 and the stop layer 72, the pattern of the collector (emitter) of the BJT is defined by the remainder of the doping layer 78. Following that, as shown in FIG. 23, another photolithographic and etching processes are used to remove a portion of the doping layer 70, so as to define the pattern of a base of the BJT. Finally, as shown in FIG. 24, a spacer 80 is formed on either side of the doping layer 70 and on either side of the doping layer 78. A self-aligned silicidation process is performed to form a silicide layer 82 on surfaces of the doing region 64, the doping layer 70 and the doping layer 78 to complete fabrication of the BJT. A top view of the BJT of the present embodiment is similar to those shown in FIGS. 15A and 15B. The doping layer 78 covers a portion of the doping layer 70, and the doping layer 70 covers a portion of the doping region 64, so that a predetermined space is reserved for forming contact plugs (silicide layers) on the doping layer 70 and the doping region 64.

In contrast to the prior art, the method of the present invention uses the doping region formed in the substrate to be the collector of the BJT. Therefore, the processing steps of forming the structures of the alignment marks, the buried doping region, the epitaxial layer, the collector and the channel stops as in the conventional BJT are not necessary in the present invention. At least five masks, three high-temperature furnace processes and several photolithographic processes, ion implantation processes and thermal treatments can be omitted from the present invention. As a result, the total number of masks for fabricating the BJT of the present invention can be effectively reduced, so as to simplify the processing steps and reduce the production costs. In comparison with the buried doping region, the epitaxial layer and the collector of the conventional BJT, a shallower collector is formed in the present invention. Therefore, the resistance of the collector can be reduced and a better electrical performance can be provided by the BJT of the present invention. In addition, the present invention may further use the doping region as the emitter, and use the second doping layer positioned at the top of the BJT structure as the collector. In this case, the advantages of omitting the conventional steps of fabricating the alignment marks, the buried doping region, the epitaxial layer, the collector and the channel stops can also be approached. The total number of masks for fabricating the BJT is therefore reduced to simplify the processing steps and reduce the production costs. Furthermore, the resistance of the collector can be reduced to provide a better electrical performance according to the present invention.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of fabricating a bipolar junction transistor, the method comprising:

providing a substrate, the substrate comprising a plurality of isolation structures for defining at least an active area;

implanting ions of a first conductive type into the substrate to form a doping region in the active area;

forming a protective layer on the substrate, the protective layer comprising an opening to expose the doping region;

forming an epitaxial layer of a second conductive type and a dielectric layer on the substrate;

removing a portion of the dielectric layer in the active area down to a surface of the epitaxial layer;

forming a semiconductor layer of a first conductive type on the substrate;

removing a portion of the semiconductor layer outside the active area to form a second doping layer on the doping region;

removing the entire dielectric layer; and removing a portion of the epitaxial layer to form a first doping layer on the doping region.

2. The method of claim 1 wherein the doping region comprises an N-type doping region.

3. The method of claim 2 wherein the first doping layer comprises a P-type epitaxial layer made of silicon/silicon germanium.

4. The method of claim 2 wherein the second doping layer comprises an N-type epitaxial layer or an N-type polysilicon layer.

5. The method of claim 1 further comprising:

forming a spacer on either side of the first doping layer and on either side of the second doping layer; and forming a silicide layer on surfaces of the doping region, the first doping layer and the second doping layer.

6. The method of claim 1 wherein the doping region comprises an emitter of the bipolar junction transistor, the first doping layer comprises a base of the bipolar junction transistor, and the second doping layer comprises a collector of the bipolar junction transistor.

7. The method of claim 1 wherein the doping region comprises a collector of the bipolar junction transistor, the first doping layer comprises a base of the bipolar junction transistor, and the second doping layer comprises an emitter of the bipolar junction transistor.

8. The method of claim 1 wherein the semiconductor layer is an epitaxial layer.

9. The method of claim 1 wherein the semiconductor layer is a polysilicon layer.

* * * * *